(12) United States Patent
Wang (10) Patent No.: US 12,183,247 B2
(45) Date of Patent: Dec. 31, 2024

(54) DISPLAY PANEL AND DISPLAY DEVICE

(71) Applicants: Wuhan China Star Optoelectronics Technology Co., Ltd., Hubei (CN); Wuhan China Star Optoelectronics Semiconductor Display Technology Co., Ltd., Hubei (CN)

(72) Inventor: Kui Wang, Hubei (CN)

(73) Assignees: Wuhan China Star Optoelectronics Technology Co., Ltd., Wuhan (CN); Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 0 days.

(21) Appl. No.: 17/421,398

(22) PCT Filed: May 31, 2021

(86) PCT No.: PCT/CN2021/097221
§ 371 (c)(1),
(2) Date: Jul. 8, 2021

(87) PCT Pub. No.: WO2022/241828
PCT Pub. Date: Nov. 24, 2022

(65) Prior Publication Data
US 2024/0021133 A1    Jan. 18, 2024

(30) Foreign Application Priority Data

May 20, 2021   (CN) .......................... 202110552062.3

(51) Int. Cl.
*G09G 3/20*          (2006.01)

(52) U.S. Cl.
CPC ..... *G09G 3/2074* (2013.01); *G09G 2300/0452* (2013.01); *G09G 2300/046* (2013.01); *G09G 2320/0626* (2013.01)

(58) Field of Classification Search
CPC ......... G09G 3/2074; G09G 2300/0452; G09G 2300/046; G09G 2320/0626;
(Continued)

(56) References Cited

U.S. PATENT DOCUMENTS

| 2014/0078126 | A1 | 3/2014 | Hack et al. |
| 2020/0006443 | A1* | 1/2020 | Park .................... H10K 59/352 |
| 2022/0037423 | A1* | 2/2022 | Zhang ............. H10K 59/80515 |

FOREIGN PATENT DOCUMENTS

| CN | 1839478 | 9/2006 |
| CN | 102891262 | 1/2013 |

(Continued)

*Primary Examiner* — Abhishek Sarma (57) ABSTRACT

The present application provides a display panel and a display device. the display panel includes a display region and a light-transmitting display region. The display region includes a first pixel unit. The light-transmitting display region includes a second pixel unit. The second pixel unit includes a first subpixel, a second subpixel, and a third subpixel. At least one subpixel of the first subpixel, the second subpixel, and the third subpixel includes at least two light-emitting layers connected in series. The display panel and the display device provided by the present application can increase a lifespan of the subpixel in the light-transmitting display region and reduce a power consumption of the display panel and the display device.

16 Claims, 8 Drawing Sheets

(58) Field of Classification Search
CPC .. H10K 59/1213; H10K 50/19; H10K 59/351; H10K 59/121; H10K 59/60; H10K 59/12
See application file for complete search history.

(56) References Cited

FOREIGN PATENT DOCUMENTS

| | | |
|---|---|---|
| CN | 103681762 | 3/2014 |
| CN | 104810381 | 7/2015 |
| CN | 108258156 | 7/2018 |
| CN | 209282205 | 8/2019 |
| CN | 110335884 | 10/2019 |
| CN | 110416275 | 11/2019 |
| CN | 110620129 | 12/2019 |
| CN | 110783385 | 2/2020 |
| CN | 111146261 | 5/2020 |
| CN | 111508994 | 8/2020 |
| CN | 111682125 | 9/2020 |
| CN | 112119446 | 12/2020 |
| CN | 112151591 | 12/2020 |
| CN | 110649063 | 1/2022 |
| KR | 10-2017-0024182 | 3/2017 |

\* cited by examiner

DISPLAY PANEL AND DISPLAY DEVICE

RELATED APPLICATIONS

This application is a National Phase of PCT Patent Application No. PCT/CN2021/097221 having International filing date of May 31, 2021, which claims the benefit of priority of Chinese Patent Application No. 202110552062.3 filed on May 20, 2021. The contents of the above applications are all incorporated by reference as if fully set forth herein in their entirety.

FIELD AND BACKGROUND OF THE INVENTION

The present application is related to the field of display technology and specifically to a display panel and a display device.

Under-screen optical sensor technology is to place an optical sensor under a screen. Through this special display panel design, a display panel can not only achieve a complete display of a full-screen display, but also ensure a normal operation of the optical sensor. However, a pixel arrangement density of an optical sensor placement region of a current display panel is low, resulting in a dark brightness in the optical sensor placement region. When a brightness of the optical sensor placement region is adjusted to be consistent with a brightness of a normal display region, a lifespan of pixels in the optical sensor placement region will be decreased, and a power consumption of the display panel will be increased.

SUMMARY OF THE INVENTION

The present application provides a display panel and a display device, which can increase a lifespan of a subpixel in a light-transmitting display region and reduce a power consumption of the display panel.

The present application provides a display panel including a display region and a light-transmitting display region.

The display region includes a first pixel unit. The light-transmitting display region includes a second pixel unit.

The second pixel unit includes a first subpixel, a second subpixel, and a third subpixel. At least one subpixel of the first subpixel, the second subpixel, and the third subpixel includes at least two light-emitting layers connected in series.

In an embodiment of the present application, a lifespan of the first subpixel is less than a lifespan of the second subpixel, and the lifespan of the second subpixel is less than a lifespan of the third subpixel. The subpixel including the at least two light-emitting layers connected in series is the first subpixel, a combination of the first subpixel and the second subpixel, or a combination of the first subpixel, the second subpixel, and the third subpixel.

In an embodiment of the present application, the first subpixel is a blue subpixel, the second subpixel is a green subpixel, and the third subpixel is a red subpixel.

In an embodiment of the present application, the second pixel unit further includes an additional subpixel. The additional subpixel includes at least two light-emitting layers connected in series.

In an embodiment of the present application, the additional subpixel is a combination of a red light-emitting layer and a cyan light-emitting layer connected in series, a combination of a blue light-emitting layer and an orange light-emitting layer connected in series, a combination of a green light-emitting layer and a magenta light-emitting layer connected in series, or a combination of the red light-emitting layer, the green light-emitting layer, and the blue light-emitting layer connected in series.

In an embodiment of the present application, an area of the additional subpixel is equal to an area of the first subpixel, an area of the second subpixel, or an area of the third subpixel.

In an embodiment of the present application, an arrangement density of the first pixel unit is greater than or equal to an arrangement density of the second pixel unit.

In an embodiment of the present application, an area of the first pixel unit is less than or equal to an area of the second pixel unit.

In an embodiment of the present application, a brightness of the display region is greater than or equal to a brightness of the light-transmitting display region.

In an embodiment of the present application, the subpixel including the at least two light-emitting layers connected in series includes an anode layer, a hole injection layer, a first hole transport layer, a first light-emitting layer, an electron transport layer, a charge generation layer, a second hole transport layer, a second light-emitting layer, an electron injection layer, and a cathode layer.

In an embodiment of the present application, the display panel further includes a driving circuit layer. The driving circuit layer includes a first driving circuit and a second driving circuit. The first driving circuit is disposed in the display region and is electrically connected to the first pixel unit. The second driving circuit is disposed in the display region adjacent to the light-transmitting display region and is electrically connected to the second pixel unit.

The present application further provides a display device. the display device includes a display panel. the display panel includes a display region and a light-transmitting display region.

The display region includes a first pixel unit. The light-transmitting display region includes a second pixel unit.

The second pixel unit includes a first subpixel, a second subpixel, and a third subpixel. At least one subpixel of the first subpixel, the second subpixel, and the third subpixel includes at least two light-emitting layers connected in series.

In an embodiment of the present application, a lifespan of the first subpixel is less than a lifespan of the second subpixel, and the lifespan of the second subpixel is less than a lifespan of the third subpixel.

The subpixel including the at least two light-emitting layers connected in series is the first subpixel, a combination of the first subpixel and the second subpixel, or a combination of the first subpixel, the second subpixel, and the third subpixel.

In an embodiment of the present application, the first subpixel is a blue subpixel, the second subpixel is a green subpixel, and the third subpixel is a red subpixel.

In an embodiment of the present application, the second pixel unit further includes an additional subpixel. The additional subpixel includes at least two light-emitting layers connected in series.

In an embodiment of the present application, the additional subpixel is a combination of a red light-emitting layer and a cyan light-emitting layer connected in series, a combination of a blue light-emitting layer and an orange light-emitting layer connected in series, a combination of a green light-emitting layer and a magenta light-emitting layer connected in series, or a combination of the red light-emitting layer, the green light-emitting layer, and the blue light-emitting layer connected in series.

In an embodiment of the present application, an area of the additional subpixel is equal to an area of the first subpixel, an area of the second subpixel, or an area of the third subpixel.

In an embodiment of the present application, an arrangement density of the first pixel unit is greater than or equal to an arrangement density of the second pixel unit.

In an embodiment of the present application, an area of the first pixel unit is less than or equal to an area of the second pixel unit.

In an embodiment of the present application, the subpixel including the at least two light-emitting layers connected in series includes an anode layer, a hole injection layer, a first hole transport layer, a first light-emitting layer, an electron transport layer, a charge generation layer, a second hole transport layer, a second light-emitting layer, an electron injection layer, and a cathode layer.

The display panel includes the display region and the light-transmitting display region. The display region includes the first pixel unit. The light-transmitting display region includes the second pixel unit. The second pixel unit includes the first subpixel, the second subpixel, and the third subpixel. At least one subpixel of the first subpixel, the second subpixel, and the third subpixel includes at least two light-emitting layers connected in series. When a same luminous intensity is achieved, a driving voltage required by the subpixel including the two light-emitting layers connected in series is half of a driving voltage required by a subpixel including one light-emitting layer. Meanwhile, because the lifespan of the subpixel is related to characteristics of a material of the light-emitting layer and an amount of a current passing through the subpixel, when the current passing through the subpixel is too large, heat and other losses will occur, which affects a lifespan of the subpixel. By configuring the at least one subpixel in the light-transmitting display region to include the at least two light-emitting layers connected in series, the present application can increase the lifespan of the subpixel in the light-transmitting display region and reduce the power consumption of the display panel and the display device.

BRIEF DESCRIPTION OF THE SEVERAL VIEWS OF THE DRAWINGS

In order to describe technical solutions in the present application clearly, drawings to be used in the description of embodiments will be described briefly below. Obviously, drawings described below are only for some embodiments of the present application, and other drawings can be obtained by those skilled in the art based on these drawings without creative efforts.

DESCRIPTION OF SPECIFIC EMBODIMENTS OF THE INVENTION

It should be explained that ordinal terms "first", "second", and "third" mentioned in the present application do not represent any order, quantity, or importance, but are only used to distinguish different portions. In the drawings, units of similar structures are using the same numeral to represent.

A pixel arrangement density of an optical sensor placement region of a display panel is low, resulting in a dark brightness in the optical sensor placement region. When a brightness of the optical sensor placement region is adjusted to be consistent with a brightness of a normal display region, a lifespan of pixels in the optical sensor placement region will be decreased, and a power consumption of the display panel will be increased. The present application provides a display panel, which can increase a lifespan of light-emitting units in the optical sensor placement region and reduce the power consumption of the display panel. The present application is described in detailed in conjunction with specific embodiments as follows. During a transmission process of a light emitted by a light-emitting layer, it interferes with a light emitted by an adjacent subpixel, so a contrast and a color purity of the display panel are affected. The display panel provided by the present application can increase the contrast and the color purity of the display panel and the display device. The present application is described in detailed in conjunction with specific embodiments as follows.

Figure 1:
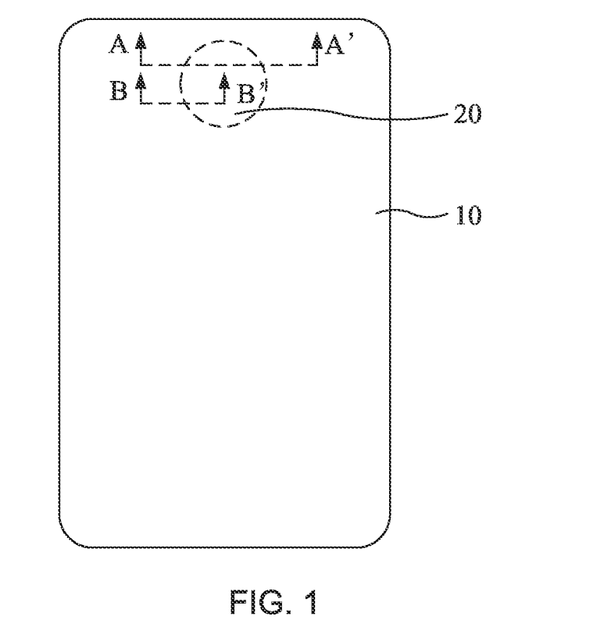
FIG. 1 is a structural schematic diagram of a plane view of a display panel provided by the present application.
Figure 2:
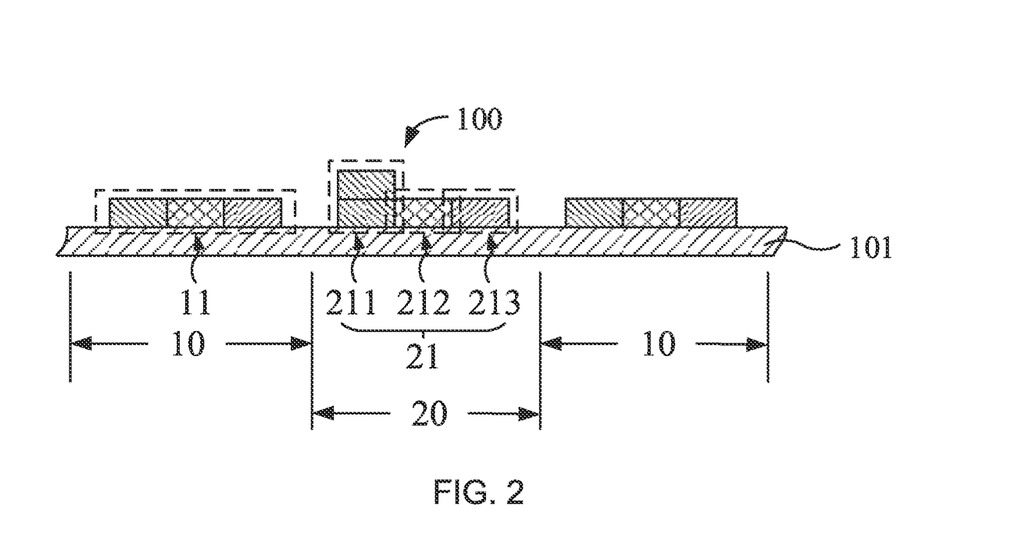
FIG. 2 is a cross-sectional diagram of a first embodiment of the display panel shown in FIG. 1 along a line AA'.

Please refer to FIGS. 1 and 2. FIG. 1 is a structural schematic diagram of a plane view of a display panel provided by the present application. FIG. 2 is a cross-sectional diagram of a first embodiment of the display panel shown in FIG. 1 along a line AA'.

The display panel 100 provided by the present application includes a display region 10 and a light-transmitting display region 20. The light-transmitting display region 20 can be positioned in the display region 10 or can be positioned at one end of the display panel 100 and coincide with one side (not shown) of the display panel 100. A shape of the light-transmitting display region 20 can be circular, square, oval, or other shapes. The display region 10 includes a first pixel unit 11. The light-transmitting display region 20 includes a second pixel unit 21. The second pixel unit 21 includes a first subpixel 211, a second subpixel 212, and a third subpixel 213. At least one subpixel of the first subpixel 211, the second subpixel 212, and the third subpixel 213 includes at least two light-emitting layers connected in series. A thickness of the two light-emitting layers connected in series can be same or different. The display panel 100 further includes a substrate 101. The first pixel unit 11 and the second pixel unit 21 are disposed on one side of the substrate 101. The substrate 101 can be a glass substrate, a flexible substrate, or an array substrate.

As shown in FIG. 2, the subpixel including the at least two light-emitting layers connected in series is the first subpixel 211.

In an embodiment, the subpixel including the at least two light-emitting layers connected in series can also be the second subpixel 212 or the third subpixel 213.

Figure 3:
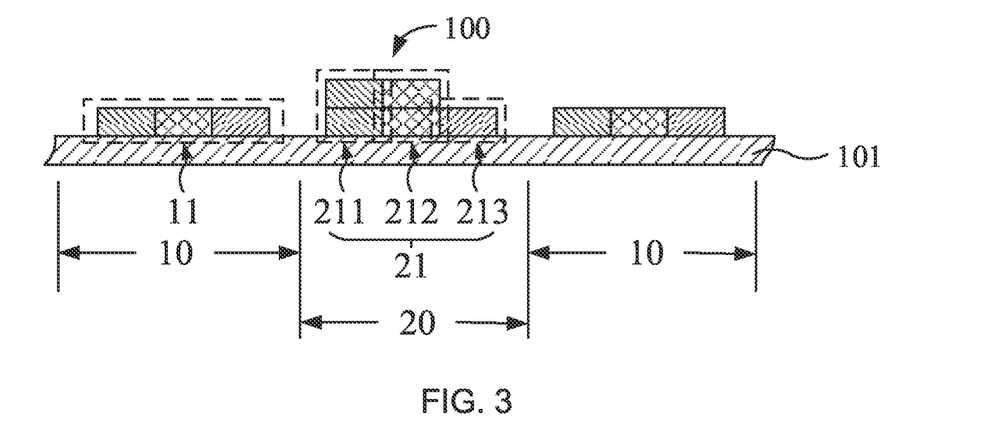
FIG. 3 is a cross-sectional diagram of a second embodiment of the display panel shown in FIG. 1 along the line AA'.

Please refer to FIG. 3. FIG. 3 is a cross-sectional diagram of a second embodiment of the display panel shown in FIG. 1 along the line AA'.

A difference between the display panel 100 in FIG. 3 and the display panel 100 in FIG. 2 is that the subpixel including the at least two light-emitting layers connected in series is a combination of the first subpixel 211 and the second subpixel 212.

In an embodiment, the subpixel including the at least two light-emitting layers connected in series can also be a combination of the first subpixel 211 and the third subpixel 213 or a combination of the second subpixel 212 and the third subpixel 213.

Figure 4:
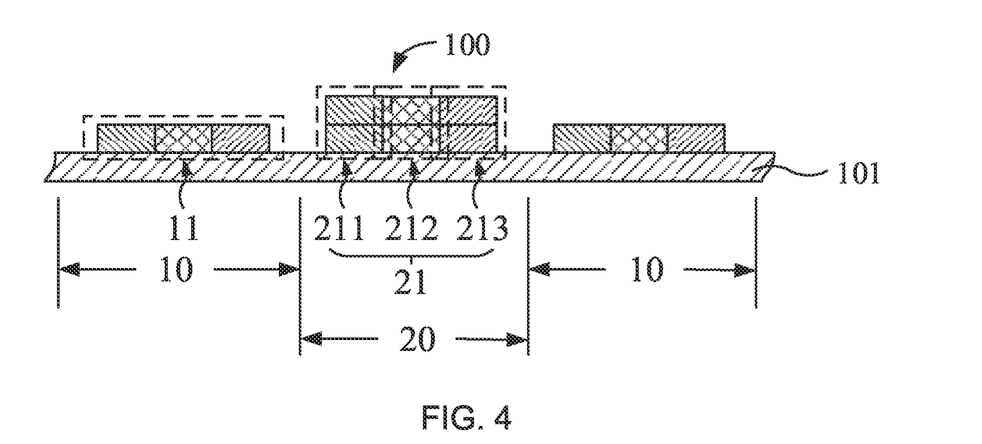
FIG. 4 is a cross-sectional diagram of a third embodiment of the display panel shown in FIG. 1 along the line AA'.

Please refer to FIG. 4. FIG. 4 is a cross-sectional diagram of a third embodiment of the display panel shown in FIG. 1 along the line AA'.

A difference between the display panel 100 in FIG. 4 and the display panel 100 in FIG. 2 is that the subpixel including the at least two light-emitting layers connected in series is a combination of the first subpixel 211, the second subpixel 212, and the third subpixel 213.

It is understandable that under a condition of applying a same voltage, a luminous intensity of the subpixel including the at least two light-emitting layers connected in series is approximately twice of a luminous intensity of a subpixel including one light-emitting layer. In a same way, when a same luminous intensity is achieved, a driving voltage required by the subpixel including the at least two light-emitting layers connected in series is half of a driving voltage required by the subpixel including the one light-emitting layer. Meanwhile, because the lifespan of the subpixel is related to characteristics of a material of the light-emitting layer and an amount of a current passing through the subpixel, when the current passing through the subpixel is too large, heat and other losses will occur, which affects the lifespan of the subpixel. By configuring the at least one subpixel in the light-transmitting display region 20 to include the at least two light-emitting layers connected in series, the present application can increase the lifespan of the subpixel in the light-transmitting display region 20 and reduce the power consumption of the display panel 100.

Please continue to refer to FIGS. 2-4. In an embodiment, a lifespan of the first subpixel 211 is less than a lifespan of the second subpixel 212, and the lifespan of the second subpixel 212 is less than a lifespan of the third subpixel 213. The subpixel including the at least two light-emitting layers connected in series is the first subpixel 211, the combination of the first subpixel 211 and the second subpixel 212, or the combination of the first subpixel 211, the second subpixel 212, and the third subpixel 213.

An area of the first subpixel 211 can be greater than an area of the second subpixel 212. The area of the second subpixel 212 can be greater than an area of the third subpixel 213. Furthermore, the areas of the first subpixel 211, the second subpixel 212, and the third subpixel 213 can be same. It can be understood that increasing the area of the subpixel can also increase the luminous intensity.

By configuring the at least one subpixel with a short lifespan or a relatively short lifespan to include a pixel structure of the at least two light-emitting layers connected in series, the present application can reduce a voltage required to drive the subpixel with the short lifespan or the relatively short lifespan. In addition, an influence of heat and other losses on the subpixel with the short lifespan or the relatively short lifespan can be reduced, thereby increasing the lifespan of the subpixel in the light-transmitting display region 20 and reducing the power consumption of the display panel 100.

In an embodiment, the first subpixel 211 is a blue subpixel, the second subpixel 212 is a green subpixel, and the third subpixel 213 is a red subpixel.

By configuring the first subpixel 211 to be the blue subpixel, the second subpixel 212 to be the green subpixel, and the third subpixel 213 to be the red subpixel, the present application achieves a color display of the display panel 100.

Figure 5:
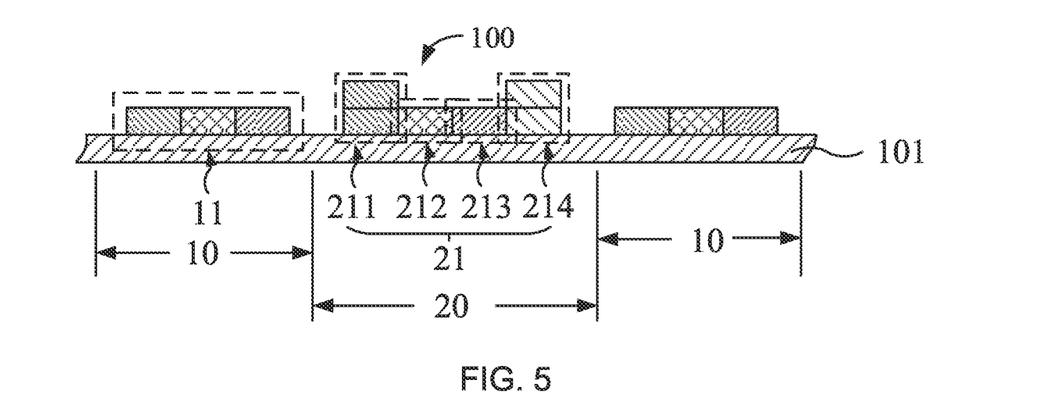
FIG. 5 is a cross-sectional diagram of a fourth embodiment of the display panel shown in FIG. 1 along the line AA'.

Please refer to FIG. 5. FIG. 5 is a cross-sectional diagram of a fourth embodiment of the display panel shown in FIG. 1 along the line AA'.

In this embodiment, the second pixel unit 21 further includes an additional subpixel 214. The additional subpixel 214 includes at least two light-emitting layers connected in series. Specifically, the subpixel including the at least two light-emitting layers connected in series can also be the first subpixel 211.

In an embodiment, the subpixel including the at least two light-emitting layers connected in series can also be the second subpixel 212 or the third subpixel 213.

Figure 6:
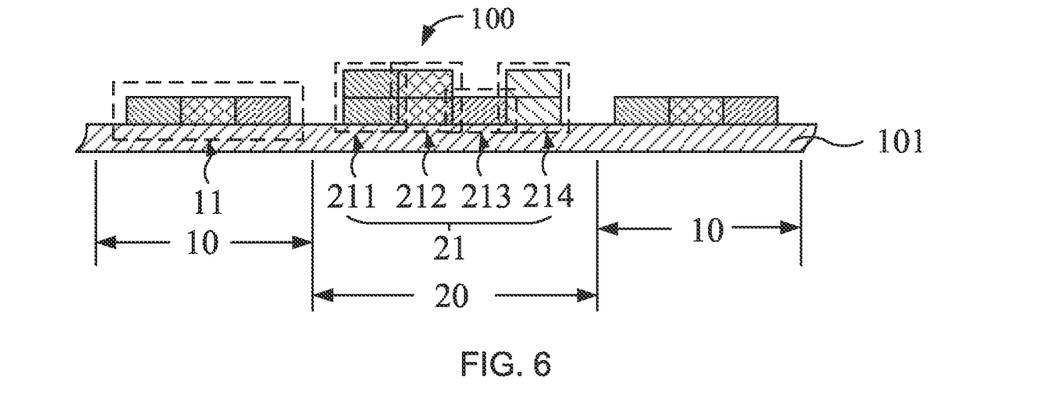
FIG. 6 is a cross-sectional diagram of a fifth embodiment of the display panel shown in FIG. 1 along the line AA'.

Please refer to FIG. 6. FIG. 6 is a cross-sectional diagram of a fifth embodiment of the display panel shown in FIG. 1 along the line AA'.

A difference between the display panel 100 in FIG. 6 and the display panel 100 in FIG. 5 is that the subpixel including the at least two light-emitting layers connected in series is the combination of the first subpixel 211 and the second subpixel 212.

In an embodiment, the subpixel including the at least two light-emitting layers connected in series can also be the combination of the first subpixel 211 and the third subpixel 213 or the combination of the second subpixel 212 and the third subpixel 213.

Figure 7:
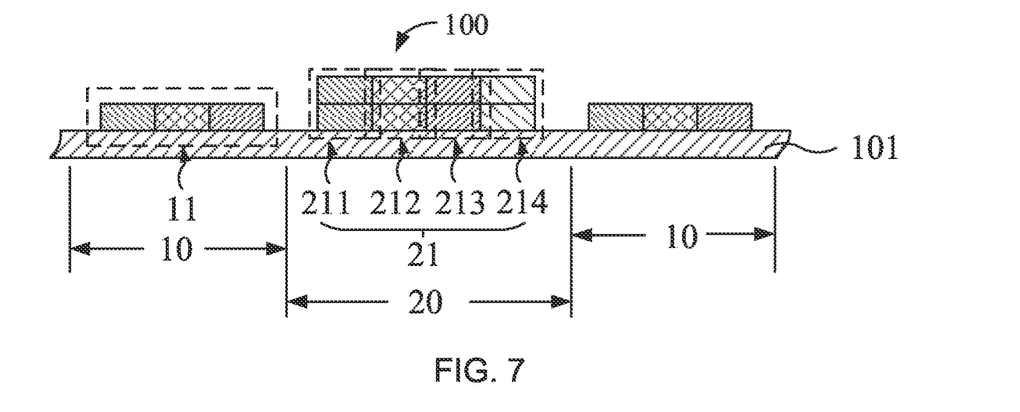
FIG. 7 is a cross-sectional diagram of a sixth embodiment of the display panel shown in FIG. 1 along the line AA'.

Please refer to FIG. 7. FIG. 7 is a cross-sectional diagram of a sixth embodiment of the display panel shown in FIG. 1 along the line AA'.

A difference between the display panel 100 in FIG. 7 and the display panel 100 in FIG. 5 is that the subpixel including the at least two light-emitting layers connected in series is the combination of the first subpixel 211, the second subpixel 212, and the third subpixel 213.

Specifically, the additional subpixel 214 can emit white light. Therefore, under a condition of achieving a same brightness, the voltage required to drive the subpixel can be reduced. By configuring the additional subpixel 214 in the second pixel unit 21, the present application can reduce the voltage required to drive the subpixel. In addition, the influence of heat and other losses on the subpixel with the short lifespan or the relatively short lifespan can be reduced, thereby increasing the lifespan of the subpixel in the light-transmitting display region 20 and reducing the power consumption of the display panel 100.

Please continue to refer to FIGS. 5-7. In an embodiment, the additional subpixel 214 is a combination of a red light-emitting layer and a cyan light-emitting layer connected in series, a combination of a blue light-emitting layer and an orange light-emitting layer connected in series, a combination of a green light-emitting layer and a magenta light-emitting layer connected in series, or a combination of the red light-emitting layer, the green light-emitting layer, and the blue light-emitting layer connected in series.

It can be understood that red and cyan, blue and orange, and green and magenta are complementary colors of light. When two corresponding colors of light can be mixed in a certain proportion to become white light, the two colors of light are called complementary colors of light. Therefore, the additional subpixel 214 can emit white light.

Figure 8:
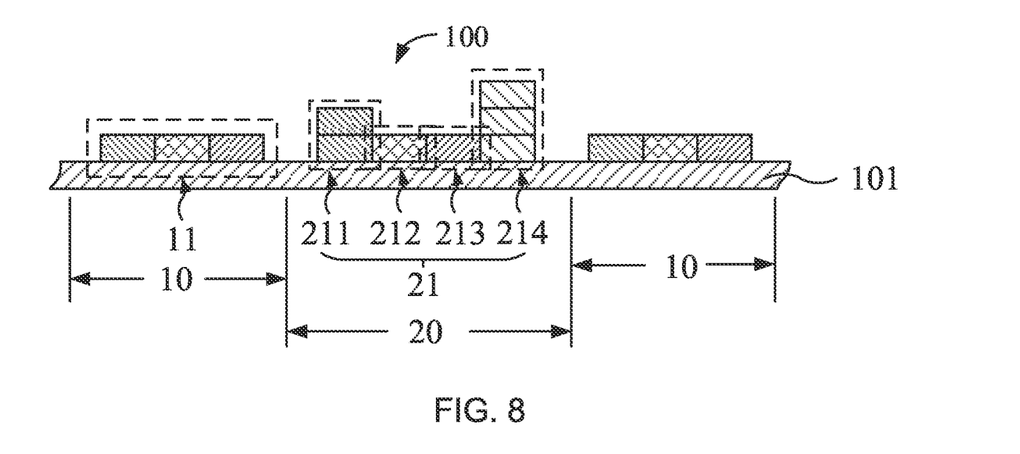
FIG. 8 is a cross-sectional diagram of a seventh embodiment of the display panel shown in FIG. 1 along the line AA'.
Figure 9:
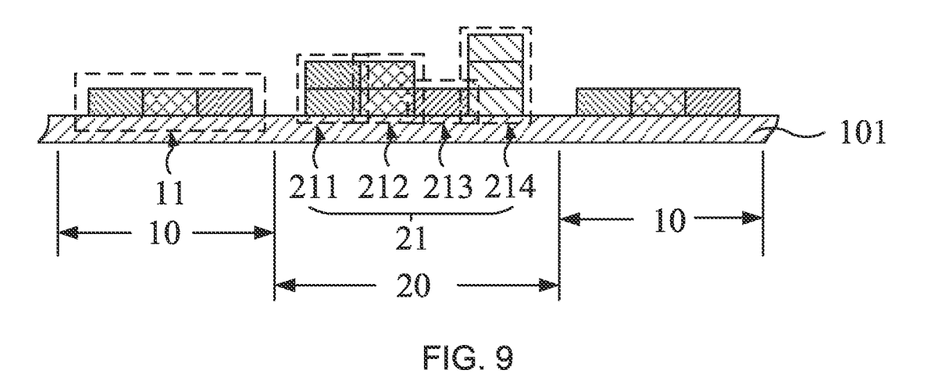
FIG. 9 is a cross-sectional diagram of an eighth embodiment of the display panel shown in FIG. 1 along the line AA'.
Figure 10:
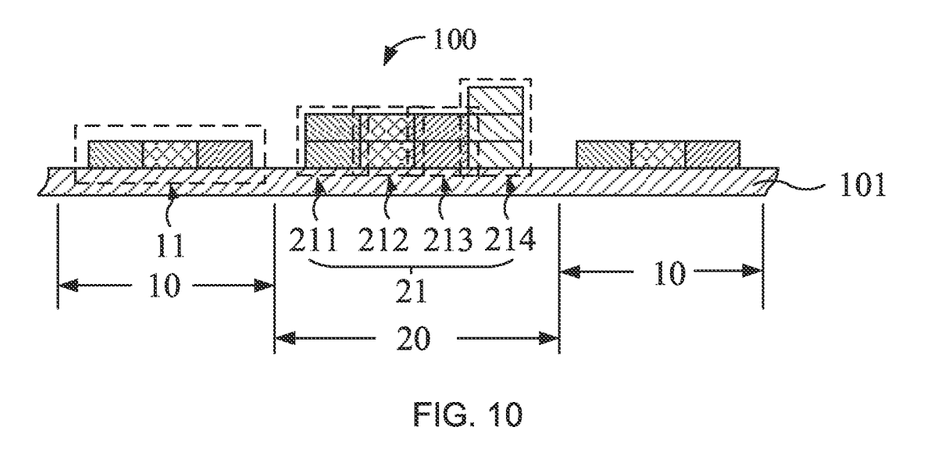
FIG. 10 is a cross-sectional diagram of a ninth embodiment of the display panel shown in FIG. 1 along the line AA'.

Please refer to FIGS. 8-10. In an embodiment of the present application, the additional subpixel 214 can be a combination of the red light-emitting layer, the green light-emitting layer, and the blue light-emitting layer connected in series.

It can be understood that red, green, and blue are three primary colors of light. Combining the three primary colors in equal amounts can obtain white light. Therefore, the additional subpixel 214 can emit white light.

Please refer to FIG. 8. FIG. 8 is a cross-sectional diagram of a seventh embodiment of the display panel shown in FIG. 1 along the line AA'.

A difference between the display panel 100 in FIG. 8 and the display panel 100 in FIG. 5 is that the additional subpixel 214 is the combination of the red light-emitting layer, the green light-emitting layer, and the blue light-emitting layer connected in series.

Please refer to FIG. 9. FIG. 9 is a cross-sectional diagram of an eighth embodiment of the display panel shown in FIG. 1 along the line AA'.

A difference between the display panel 100 in FIG. 9 and the display panel 100 in FIG. 6 is that the additional subpixel 214 is the combination of the red light-emitting layer, the green light-emitting layer, and the blue light-emitting layer connected in series.

Please refer to FIG. 10. FIG. 10 is a cross-sectional diagram of a ninth embodiment of the display panel shown in FIG. 1 along the line AA'.

A difference between the display panel 100 in FIG. 10 and the display panel 100 in FIG. 7 is that the additional subpixel 214 is the combination of the red light-emitting layer, the green light-emitting layer, and the blue light-emitting layer connected in series.

The present application disposes the additional subpixel 214 in the second pixel unit 21. The additional subpixel 214 obtains white light through a combination of the complementary colors of light or a combination of the three primary colors of light. Under the condition of achieving the same brightness, the voltage required to drive the subpixel can be reduced. In addition, the influence of heat and other losses on the subpixel with the short lifespan or the relatively short lifespan can be reduced, thereby increasing a lifespan of a subpixel in the second pixel unit 21 and reducing the power consumption of the display panel 100.

Figure 11:
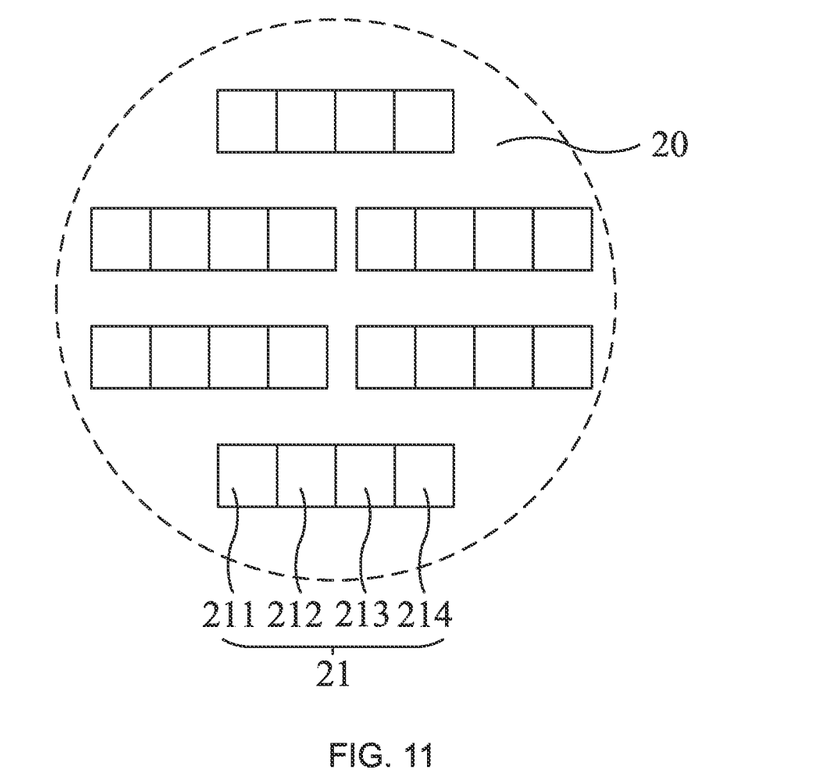
FIG. 11 is a schematic diagram of an arrangement of pixel units of a light-transmitting display region of the display panel shown in FIG. 1.

Please refer to FIG. 11. FIG. 11 is a schematic diagram of an arrangement of pixel units of a light-transmitting display region of the display panel shown in FIG. 1.

In an embodiment of the present application, an area of the additional subpixel 214 is same as the area of the first subpixel 211, the second subpixel 212, or the third subpixel 213. Specifically, the term "area" here refers to a light-emitting area of the subpixel.

It can be understood that by adjusting the area of the additional subpixel 214 to be same as the area of the subpixel with a short lifespan in the second pixel unit 21, an optical compensation for the subpixel with the short lifespan can be increased. This reduces the current passing through the subpixel with the shorter lifespan and can reduce the influence of heat and other losses on the subpixel with the short lifespan, thereby increasing the lifespan of the subpixel in the second pixel unit 21 and also reducing the power consumption of the display panel 100.

Figure 12:
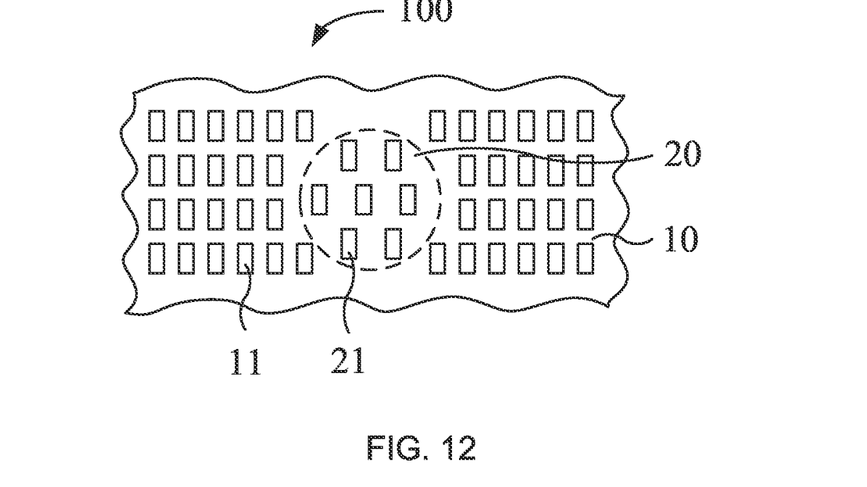
FIG. 12 is a schematic diagram of an arrangement of pixel units of the display panel shown in FIG. 1.

Please refer to FIG. 12. FIG. 12 is a schematic diagram of an arrangement of pixel units of the display panel shown in FIG. 1.

In an embodiment, an arrangement density of the first pixel unit 11 is greater than or equal to an arrangement density of the second pixel unit 21.

It can be understood that the first pixel unit 11 is positioned in the display region 10. The display region 10 is configured for a normal display of the display panel 100. The second pixel unit 21 is positioned in the light-transmitting display region 20. An optical sensor can be disposed under the light-transmitting display region 20, so that the light-transmitting display region 20 has both a display function and a light-transmitting function. In the present application, a light transmittance of the light-transmitting display region 20 can be ensured by determining the arrangement density of the first pixel unit 11 to be greater than or equal to the arrangement density of the second pixel unit 21. Therefore, the display panel 100 can not only achieve a complete display of a full-screen display, but also ensure a normal operation of the optical sensor.

In an embodiment of the present application, an area of the first pixel unit 11 is less than or equal to an area of the second pixel unit 21.

It can be understood that when the arrangement density of the second pixel unit 21 is less than or equal to the arrangement density of the first pixel unit 11, a high luminous intensity can be obtained by increasing the area of the second pixel unit 21. Therefore, the present application can further increase a brightness of the light-transmitting display region 20 by determining the area of the first pixel unit 11 to be less than or equal to the area of the second pixel unit 21.

In an embodiment of the present application, a brightness of the display region 10 is greater than or equal to the brightness of the light-transmitting display region 20.

It can be understood that when the arrangement density of the first pixel unit 11 of the display area 10 is greater than or equal to the arrangement density of the second pixel unit 21, the brightness of the display region 10 is greater than or equal to the brightness of the light-transmitting display region 20.

Figure 13:
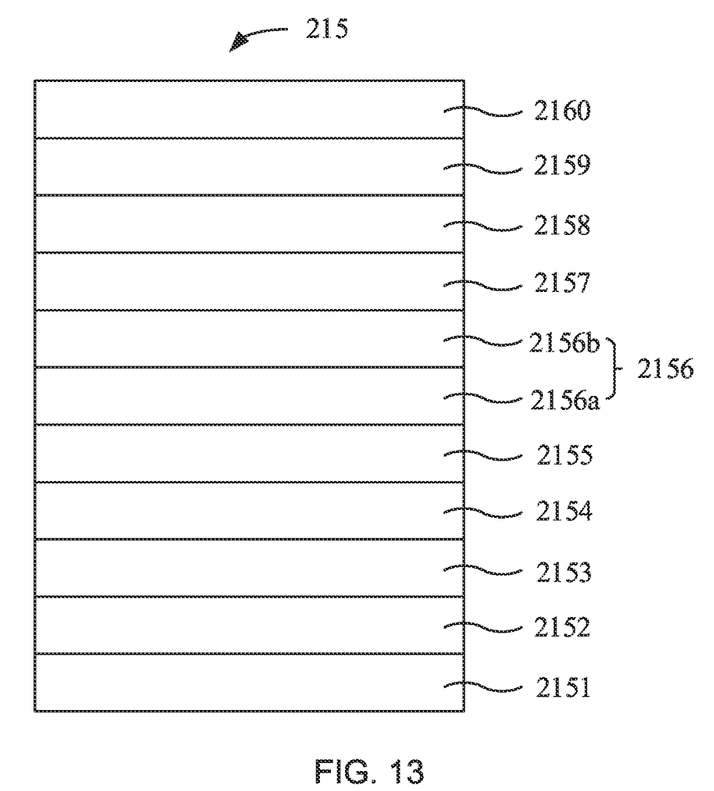
FIG. 13 is a schematic diagram of a laminated structure of a subpixel including at least two light-emitting layers connected in series provided by the present application.

Please refer to FIG. 13. FIG. 13 is a schematic diagram of a laminated structure of the subpixel including the at least two light-emitting layers connected in series provided by the present application.

In an embodiment of the present application, a structure of the subpixel 215 including the at least two light-emitting layers connected in series includes an anode layer 2151, a hole injection layer 2152, a first hole transport layer 2153, a first light-emitting layer 2154, an electron transport layer 2155, a charge generation layer 2156, a second hole transport layer 2157, a second light-emitting layer 2158, an electron injection layer 2159, and a cathode layer 2160.

The anode layer 2151 can be made of a transparent conductive oxide material. Specifically, the anode layer can be indium tin oxide (ITO) or indium zinc oxide (IZO). The anode layer 2151 can be formed by evaporation or sputtering.

The hole injection layer (HIL layer) 2152 can be made of one or more of 4,4',4"-tris(N-3-methylphenyl-N-phenylamino)triphenylamine (MTDATA), copper phthalocyanine (CuPc), and poly(3,4-ethylenedioxythiophene) polystyrene sulfonate (PEDOT/PSS). The hole injection layer (HIL layer) 2152 can be formed by the evaporation. The first hole transport layer (HTL layer) 2153 can be made of one or more of polytriphenylamine, N,N'-bis(3-methylphenyl)-N,N'-bis(phenyl)-benzidine (TPD), and N,N'-bis(naphthalen-1-yl)-N,N'-bis(phenyl)benzidine (NPB). The first hole transport layer (HTL layer) 2153 can be formed by the evaporation.

A material of the first light-emitting layer 2154 can be a fluorescent material, a phosphorescent material, or a quantum dot material. The first light-emitting layer 2154 can be formed by the evaporation or inkjet printing.

The electron transport layer (ETL layer) 2155 can be made of one or more of 8-hydroxyquinoline aluminum, oxadiazole, triazole, phenanthroline, benzoxazole, and benzothiazole. The electron transport layer (ETL layer) 2155 can be formed by the evaporation.

The charge generation layer (CGL layer) 2156 can include a two-layer structure of a direct contact N-doping layer (N-doping CGL layer) 2156a and a P-doping layer (P-doping CGL layer) 2156b. A working principle of the charge generation layer (CGL layer) 2156 is: when an electric field is applied, electron-hole dipoles in a P-N junction is divided into holes and electrons due to a built-in electric field being weaker than the applied electric field and are injected into the light-emitting layer through channels under an effect of the Zener effect. The N-doping layer (N-doping CGL layer) 2156a can be made of alkali metal doped with lithium (Li), sodium (Na), potassium (K), or cesium (Cs), or an alkaline earth metal organic layer of magnesium (Mg), strontium (Sr), barium (Ba), or radium (Ra). The P-doping layer (P-doping CGL layer) 2156b can be made of an organic layer doped with one or two of $MoO_3$ and $WO_3$. The charge generation layer (CGL layer) 2156 can be formed by the evaporation.

The second hole transport layer (HTL layer) 2157 can be made of one or more of polytriphenylamine, N,N'-bis(3-methylphenyl)-N,N'-bis(phenyl)-benzidine (TPD), and N,N'-bis(naphthalen-1-yl)-N,N'-bis(phenyl)benzidine (NPB). The second hole transport layer (HTL layer) 2157 can be formed by the evaporation.

A material of the second light-emitting layer 2158 can be the fluorescent material, the phosphorescent material, or the quantum dot material.

The second light-emitting layer 2158 can be formed by the evaporation or the inkjet printing.

The electron injection layer (EIL layer) 2159 can be made of one or more of 8-hydroxyquinoline lithium (Liq), 2-methyl-8-hydroxyquinoline lithium (LiMeq), 8-hydroxyquinoline sodium (Naq), and 8-hydroxyquinoline cesium (Csq). The electron injection layer (EIL layer) 2159 can be formed by the evaporation.

The cathode layer 2160 can be made of metal or metal alloy. Specifically, the cathode layer can be one or more of gold (Au), silver (Ag), aluminum (Al), molybdenum (Mo), and magnesium (Mg). The cathode layer 2160 can be formed by the evaporation.

It can be understood that the first light-emitting layer 2154 and the second light-emitting layer 2158 can be a combination of the fluorescent material and the fluorescent material, a combination of the fluorescent material and the phosphorescent material, a combination of the phosphorescent material and the phosphorescent material, a combination of the quantum dot material and the fluorescent material, or a combination of the quantum dot material and the phosphorescent material, etc. A thickness of the first light-emitting layer 2154 and a thickness of the second light-emitting layer 2158 can be same or different.

A material of the first hole transport layer 2153 and a material of the second hole transport layer 2157 can be same or different. A thickness of the first hole transport layer 2153 and a thickness of the second hole transport layer 2157 can be same or different.

Figure 14:
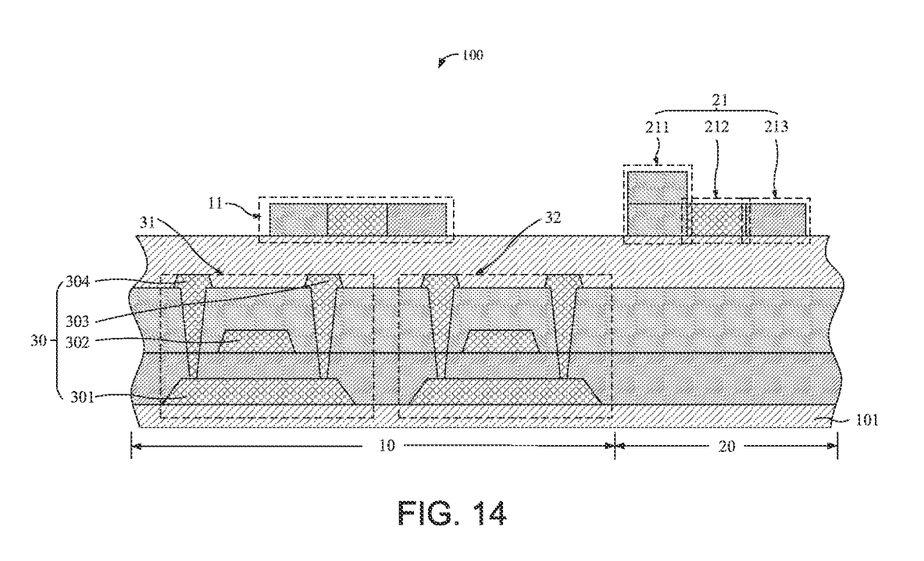
FIG. 14 is a cross-sectional diagram of a tenth embodiment of the display panel shown in FIG. 1 along a line BB'.

Please refer to FIG. 14. FIG. 14 is a cross-sectional diagram of a tenth embodiment of the display panel shown in FIG. 1 along a line BB'.

In an embodiment of the present application, the display panel 100 further includes a driving circuit layer 30. The driving circuit layer 30 includes a first driving circuit 31 and a second driving circuit 32. The first driving circuit 31 is disposed in the display region 10 and electrically connected to the first pixel unit 11. The second driving circuit 32 is disposed in the display region adjacent to the light-transmitting display region 20 and electrically connected to the second pixel unit 21.

It can be understood that the first driving circuit 31 can include a plurality of first thin-film transistors. Each of the first thin-film transistors is electrically connected to the first pixel unit 11. The second driving circuit 32 can include a plurality of second thin-film transistors. Each of the second thin-film transistors is electrically connected to the second pixel unit 21. Specifically, each of the thin-film transistors includes an active layer 301, a gate 302, a source 303, and a drain 304. The active layer 301 corresponds the gate 302. The source electrode 303 and the drain electrode 304 are positioned on both sides of the active layer 301 and are electrically connected to the active layer 301. The present application respectively controls the first pixel unit 11 and the second pixel unit 21 by configurations of the first driving circuit 31 and the second driving circuit 32, so the brightness of the display region 10 and the light-transmitting display region 20 can be controlled to be consistent. In addition, in the present application, the light transmittance of the light-transmitting display region 20 can be increased by disposing the second driving circuit 32 in the display region 10 adjacent to the light-transmitting display region 20.

Figure 15:
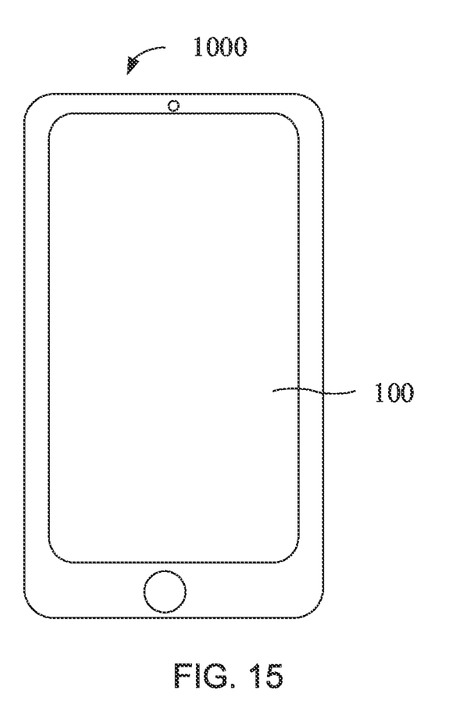
FIG. 15 is a structural schematic diagram of a plane view of a display device provided by the present application.

Please refer to FIG. 15. FIG. 15 is a structural schematic diagram of a plane view of a display device provided by the present application.

A display device 1000 provided by the present application includes a display panel 100. The display device 1000 includes the display panel 100 as described in any of the previous embodiments. The display device 1000 includes, but is not limited to the following types of electronic devices, such as rollable or foldable mobile phones, watches, bracelets, televisions, or other wearable display or touch electronic devices, and tablet computers, laptop computers, desktop monitors, televisions, smart glasses, smart watches, ATMs, digital cameras, car monitors, medical displays, industrial control displays, e-ink books, electrophoretic display devices, game consoles, transparent displays, dual surface displays, naked eye 3D displays, mirror display devices, transflective display devices, or flexible touch screens.

The display device 1000 includes the display panel 100. The display panel 100 includes the display region and the light-transmitting display region. The display region includes the first pixel unit. The light-transmitting display region includes the second pixel unit. The second pixel unit includes the first subpixel, the second subpixel, and the third subpixel. At least one subpixel of the first subpixel, the second subpixel, and the third subpixel includes the at least two light-emitting layers connected in series. When the same luminous intensity is achieved, the driving voltage required by the subpixel including the at least two light-emitting layers connected in series is half of the driving voltage required by the subpixel including the one light-emitting layer. Meanwhile, because the lifespan of the subpixel is related to the characteristics of a material itself, when the current passing through the subpixel is too large, heat and other losses will occur, which affects the lifespan of the subpixel. By configuring the at least one subpixel in the light-transmitting display region to include the at least two light-emitting layers connected in series, the present application can increase the lifespan of the subpixel in the light-transmitting display region and reduce the power consumption of the display panel 100 and the display device 1000.

Although the embodiments of the present application have been described in detail above, it is not intended to limit the present application. It should be understood that for a person of ordinary skill in the art can make various modifications of the technical solutions of the embodiments of the present application above. However, it does not depart from the scope of the technical solutions of the embodiments of the present application.

What is claimed is:

1. A display device, comprising a display panel;
   wherein the display panel comprises:
   a display region comprising a first pixel unit; and
   a light-transmitting display region comprising a second pixel unit, wherein the second pixel unit comprises a first subpixel, a second subpixel, and a third subpixel, and at least one subpixel of the first subpixel, the second subpixel, and the third subpixel comprises at least two light-emitting layers connected in series;
   wherein a lifespan of the first subpixel is less than a lifespan of the second subpixel, and the lifespan of the second subpixel is less than a lifespan of the third subpixel; and
   the subpixel comprising the at least two light-emitting layers connected in series is the first subpixel, a combination of the first subpixel and the second subpixel. or a combination of the first subpixel, the second subpixel, and the third subpixel.

2. The display device according to claim 1, wherein the first subpixel is a blue subpixel, the second subpixel is a green subpixel, and the third subpixel is a red subpixel.

3. The display device according to claim 1, wherein the second pixel unit further comprises an additional subpixel, and the additional subpixel comprises at least two light-emitting layers connected in series.

4. The display device according to claim 2, wherein the additional subpixel is a combination of a red light-emitting layer and a cyan light- emitting layer connected in series, a combination of a blue light-emitting layer and an orange light-emitting layer connected in series, a combination of a green light-emitting layer and a magenta light-emitting layer connected in series, or a combination of the red light- emitting layer, the green light-emitting layer, and the blue light-emitting layer connected in series.

5. The display device according to claim 2, wherein an area of the additional subpixel is equal to an area of the first subpixel, an area of the second subpixel, or an area of the third subpixel.

6. The display device according to claim 1, wherein an arrangement density of the first pixel unit is greater than or equal to an arrangement density of the second pixel unit.

7. A display panel, comprising:
   a display region comprising a first pixel unit; and
   a light-transmitting display region comprising a second pixel unit, wherein the second pixel unit comprises a first subpixel, a second subpixel, and a third subpixel, and at least one subpixel of the first subpixel, the second subpixel, and the third subpixel comprises at least two light-emitting layers connected in series;
   wherein a lifespan of the first subpixel is less than a lifespan of the second subpixel, and the lifespan of the second subpixel is less than a lifespan of the third subpixel; and
   the subpixel comprising the at least two light-emitting layers connected in series is the first subpixel, a combination of the first subpixel and the second subpixel. or a combination of the first subpixel, the second subpixel, and the third subpixel.

8. The display panel according to claim 7, wherein the first subpixel is a blue subpixel, the second subpixel is a green subpixel, and the third subpixel is a red subpixel.

9. The display panel according to claim 7, wherein the second pixel unit further comprises an additional subpixel, and the additional subpixel comprises at least two light-emitting layers connected in series.

10. The display panel according to claim 9, wherein the additional subpixel is a combination of a red light-emitting layer and a cyan light-emitting layer connected in series, a combination of a blue light-emitting layer and an orange light- emitting layer connected in series, a combination of a green light-emitting layer and a magenta light-emitting layer connected in series, or a combination of the red light-emitting layer, the green light-emitting layer, and the blue light-emitting layer connected in series.

11. The display panel according to claim 9, wherein an area of the additional subpixel is equal to an area of the first subpixel, an area of the second subpixel, or an area of the third subpixel.

12. The display panel according to claim 7, wherein an arrangement density of the first pixel unit is greater than or equal to an arrangement density of the second pixel unit.

13. The display panel according to claim 7, wherein an area of the first pixel unit is less than or equal to an area of the second pixel unit.

14. The display panel according to claim 7, wherein a brightness of the display region is greater than or equal to a brightness of the light-transmitting display region.

15. The display panel according to claim 7, wherein the subpixel comprising the at least two light-emitting layers connected in series comprises an anode layer, a hole injection layer, a first hole transport layer, a first light-emitting layer, an electron transport layer, a charge generation layer, a second hole transport layer, a second light-emitting layer, an electron injection layer, and a cathode layer.

16. The display panel according to claim 7, further comprising a driving circuit layer, wherein the driving circuit layer comprises a first driving circuit and a second driving circuit, the first driving circuit is disposed in the display region and is electrically connected to the first pixel unit, and the second driving circuit is disposed in the display region adjacent to the light-transmitting display region and is electrically connected to the second pixel unit.

\* \* \* \* \*